United States Patent [19]

Webb

[11] Patent Number: 4,855,625
[45] Date of Patent: Aug. 8, 1989

[54] OPERATIONAL AMPLIFIER HAVING LOW DC CURRENT INPUT CIRCUIT

[75] Inventor: Robert W. Webb, Indialantic, Fla.
[73] Assignee: Harris Corp., Melbourne, Fla.
[21] Appl. No.: 118,251
[22] Filed: Nov. 9, 1987
[51] Int. Cl.⁴ .................................................. H03K 3/26
[52] U.S. Cl. ..................................... 307/491; 307/494; 307/315; 307/454; 307/280; 357/46; 357/44; 330/257
[58] Field of Search ............... 307/491, 494, 315, 454, 307/456, 280, 319, 300, 296.6; 357/46, 44; 330/257

[56] References Cited

U.S. PATENT DOCUMENTS 3,092,729  6/1963  Cray ..................................... 307/315

FOREIGN PATENT DOCUMENTS

0195304  11/1983  Japan ................................. 330/257
1138921  2/1985  U.S.S.R. ............................. 330/257
1167698  7/1985  U.S.S.R. ............................. 330/257

Primary Examiner—Stanley D. Miller
Assistant Examiner—Nancy Thai
Attorney, Agent, or Firm—Antonelli, Terry & Wands

[57] ABSTRACT

An input circuit for an operational amplifier which incorporates a bias control transistor for effectively minimizing the input current to a Darlington-connected transistor pair into the same semiconductor region in which the Darlington-connected transistor pair is formed. All portions of the surface of the dielectrically isolated island are effectively boot-strapped with the (common mode) input signal, whereby the parasitic capacitance to ground is effectively eliminated. This enables the collector current of the input transistor to be reduced significantly relative to the collector current flowing through the output transistor of the Darlington pair. To accommodate for device characteristic variations among separate wafer processing runs, a self-balanced bias circuit, containing a transistor pair matched to the bias and Darlington output transistors, is employed as the current source of the operational amplifier. As a result, the ratio of the collector currents of the Darlington-connected pair can be controlled irrespective of saturation currents or sheet resistivity of bias resistances employed for the bias control transistor and for the self-balanced bias circuit, respectively.

28 Claims, 5 Drawing Sheets

OPERATIONAL AMPLIFIER HAVING LOW DC CURRENT INPUT CIRCUIT

FIELD OF THE INVENTION

The present invention relates in general to operational amplifier circuits and is particularly directed to a circuit configuration for effectively minimizing the DC current drawn by the input of the amplifier.

BACKGROUND OF THE INVENTION

The electrical transmission links by way of which input terminals of an operational amplifier are coupled to upstream circuitry normally include resistive current paths, thereby resulting in an IR drop across such paths which alters or shifts the actual voltage levels expected to be seen at the amplifier input terminals. It is desirable, therefore, to minimize the DC input current drawn by the amplifier and thereby improve its performance. One scheme for reducing the input current employs a Darlington-connected transistor pair, with the input transistor of the Darlington pair being biased at a very low current level. Unfortunately, this low level biasing approach dramatically reduces the signal response of the circuit for large magnitude inputs.

Figure 1:
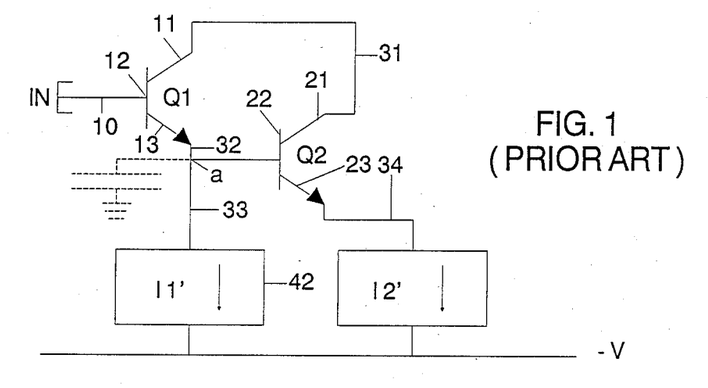
FIG. 1 is a diagrammatic illustration of a portion of an operational amplifier circuit showing the parasitic capacitance encountered in a prior art configuration.
Figure 2:
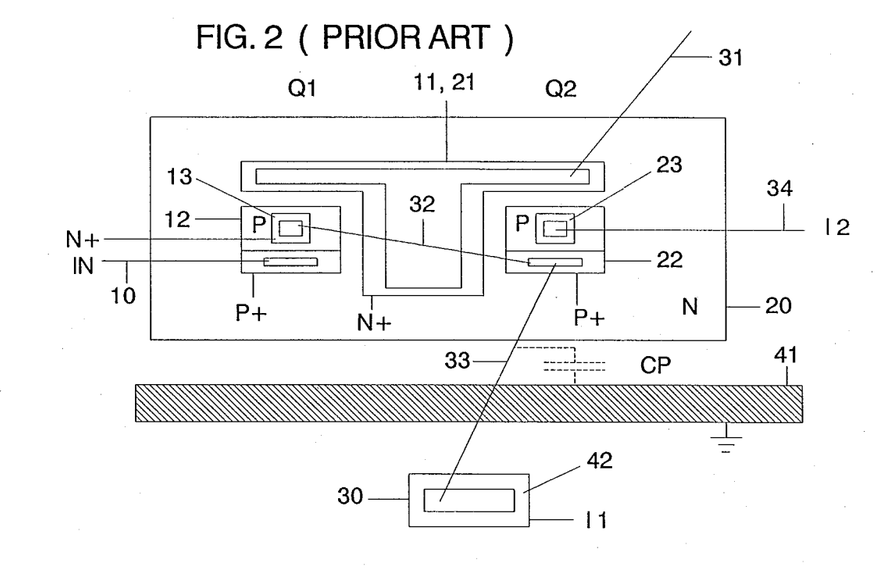
FIG. 2 is a diagrammatic illustration of the integrated circuit topology of the circuit diagram of FIG. 1.

More particularly, with attention directed to FIGS. 1 and 2 of the drawings, there are shown respectively a schematic illustration of a Darlington-connected pair of bipolar transistors Q1 and Q2 coupled between an input terminal IN and a bias current sink 42, and the topological integration of the transistors Q1 and Q2 in a dielectric isolated region 20 in a semiconductor wafer.

The Darlington pair is comprised of an input NPN transistor Q1, the base 12 of which is connected via link 10 to an input terminal IN. The collector 11 of transistor Q1 is connected in common with the collector 21 of NPN transistor Q2 and to a collector bias link 31. The emitter 13 of transistor Q1 is coupled via a link 32 to the base 22 of transistor Q2. The emitter of transistor Q2 is coupled via a link 34 to a current sink I2'. The connection of the emitter of transistor Q1 and the base of transistor Q2 is denoted by node a and is coupled over link 33 to a current sink (e.g. diode-connected transistor) 42. Links 10, 32, 33 and 34, which are typically formed of conductive interconnect material (e.g. aluminum, doped-polysilicon) disposed atop a dielectric insulator layer (e.g. SiO$_2$), are illustrated schematically in FIG. 2 to simplify the drawings. Typically, the current sink 42 is disposed in an island region 30 separate and isolated from the island region 20, as shown topologically in FIG. 2. As a result, the link 33 between node a and the current sink region 42 has a substantial length and passes over or is adjacent to a ground track or grounded semiconductor material, to induce a parasitic capacitance C$_p$ between link 33 and ground.

When a large (negative) transient is applied to the input terminal, the response at the emitter 32 (node a) of transistor Q1 will be affected by the voltage developed across parasitic capacitance C$_p$, which must be discharged. Because the DC current level for accomplishing this task has been set at a very low level (I$_1$' corresponding to the current sink 42 connected between node a and ground), the response time of the circuit is significantly impaired.

An alternative approach to the low level bias scheme shown in FIGS. 1 and 2 is to substitute a junction field effect transistor (JFET) in place of the bipolar input transistor. At high input temperature operation (+125° C.) however, the JFET limits the input current to only several nanoamperes and its incorporation into the bipolar integrated circuit structure requires an expensive increase in processing complexity.

SUMMARY OF THE INVENTION

In accordance with the present invention, the above described drawbacks of conventional proposals for minimizing the DC input current drawn by an operational amplifier are effectively eliminated by a new and improved circuit configuration which incorporates a bias control transistor for node a of the Darlington-connected transistor pair into the same semiconductor region in which the Darlington-connected transistor pair is formed. As a result, the conductive link for interconnecting the emitter of the input transistor to the bias transistor is shortened considerably and maintained in a substantially spaced-apart relationship with respect to ground track or substrate bias. Moreover, all portions of the surface of the dielectrically isolated island are effectively bootstrapped with the (common mode) input signal, whereby the parasitic capacitance from node a to ground is effectively eliminated. This enables the collector current of the input transistor to be reduced significantly relative to the collector current flowing through the output of the Darlington pair (on the order of 1:50 compared with the approximately 1:7 ratio of the configuration of the prior art shown in FIGS. 1 and 2).

To accommodate for device characteristic variations among separate wafer processing runs, a self-balanced bias circuit, containing a transistor pair matched to the bias and Darlington output transistors, is employed as the current source of the operational amplifier. As a result, the ratio of the collector currents of the Darlington-connected pair can be controlled irrespective of saturation currents or sheet resistivity of bias resistances employed for the bias control transistor (connected to node a) and for the self-balanced bias circuit, respecitvely.

DETAILED DESCRIPTION

Figure 3:
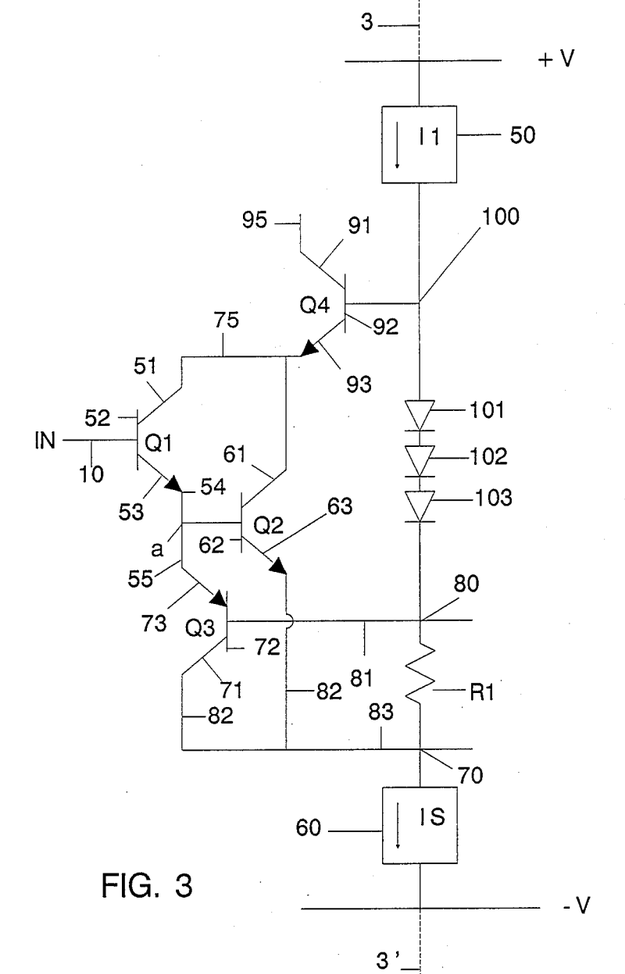
FIG. 3 is a diagrammatic illustration of one symmetrical half of an operational amplifier circuit in accordance with the present invention.
Figure 4:
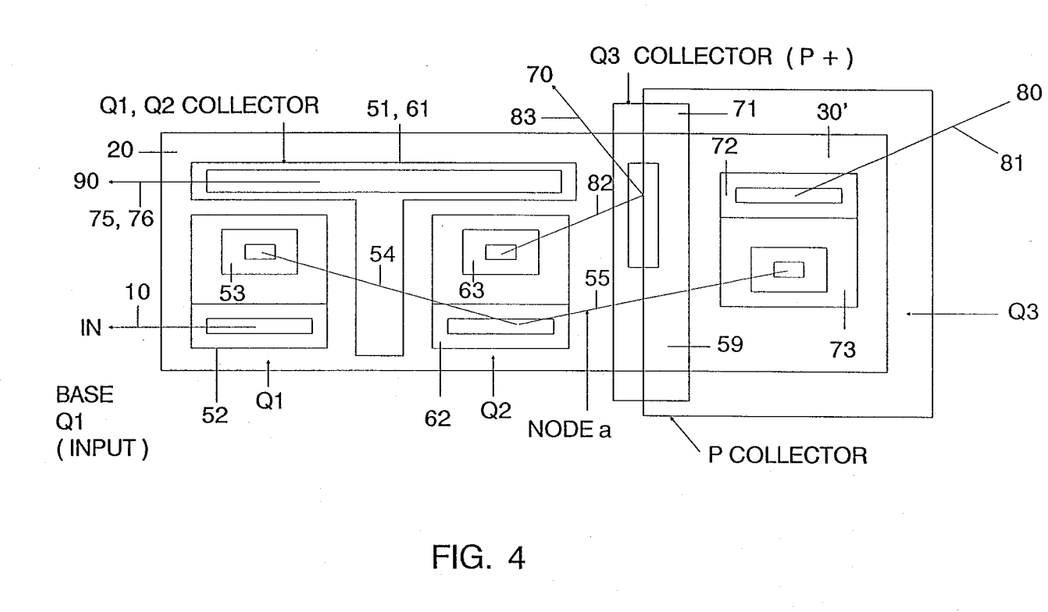
FIG. 4 is a diagrammatic illustration of the integrated circuit topology of the operational amplifier circuit diagram of FIG. 3.

Referring now to FIG. 3, there is diagrammatically illustrated one-half of an operational amplifier circuit in accordance with the present invention, the wafer topology for which is illustrated in FIG. 4. The other half of the operational amplifier circuit is identical to the configuration shown in FIG. 3 and includes a set of transistors symmetrically interconnected relative to mirror line 3—3' through which current source I$_1$, diodes 101-103, resistor R1 and current sink I$_s$ are colinear between a positive bias supply line +V and a negative bias supply line −V.

In FIGS. 3 and 4, NPN bipolar transistors Q1 and Q2 are connected as a Darlington pair just as are transistors Q1 and Q2 in the configuration shown in FIG. 1, discussed above. Also, transistors Q1 and Q2 are integrated in the same dielectrically isolated island 20 as shown in FIG. 4. The base 52 of input transistor Q1 is coupled over input link 10 to an input terminal IN. The collector 51 of transistor Q1 is coupled over link 75 to a node 90 to which a link 76 from collector 61 of transistor Q2 is coupled. Node 90 is also coupled to the emitter 93 of an NPN bias transistor Q4 the collector 91 of which is connected to a bias voltage terminal 95 and the base 92 of which is connected to a node 100 to which an input current source $I_1$ and the anode of a diode 101 are connected. Input current source 50 (to be discussed in detail below in conjunction with the description of FIG. 5) supplies a bias current $I_1$ for each of the symmetrical halves (only one being shown in FIG. 3) of the operational amplifier.

The emitter 53 of transistor Q1 is coupled over link 54 to node a and to the base 62 of transistor Q2. The emitter 63 of transistor Q2 is coupled over link 82 to the collector 71 of a bias PNP transistor Q3, the base 72 of which is coupled over link 81 to a node 80 and the emitter 73 of which is coupled over link 55 to node a. Link 82 is coupled via link 83 to node 70, to which one end of a resistor R1 is coupled. The other end of resistor R1 is coupled to node 80. Also, diodes 102 and 103 are coupled in series with diode 101 between nodes 100 and 80. Each of diodes 101, 102 and 103 is preferably formed of a diode-connected bipolar transistor, having the same geometry as NPN transistors Q1, Q2 and Q4, for providing a triple voltage drop (3 $V_{be}$) between nodes 80 and 100 to match the base-emitter voltage drops through transistors Q1, Q3 and Q4 are to provide temperature compensation therefor. A bias current ($I_s$) sink 60 is coupled between node 80 and a negative voltage supply link −V, as described above.

As shown in FIG. 4, NPN transistors Q1 and Q2 are formed in the same dielectrically isolated well 20, the major portion of which is N type material (corresponding to the collector regions of transistors Q1 and Q2). At the right-hand portion of island region 20, as viewed in FIG. 4, the island is overlapped with a P type region 30' which forms the P type collector of transistor Q3. The respective N base region 72 and P emitter region 73 of transistor Q3 are formed in the P region 30' so that, in effect, each of transistors Q1, Q2 and Q3 is formed in the same dielectrically isolated island region. The P type collector material of the island region 30' forms a PN junction 59 with N type collector region of island region 20. By virtue of transistor Q4 and the connection of the collector 71 of transistor Q3 through current source 60 to negative supply line −V, PN junction 59 is effectively back-biased. Transistor Q4 maintains the N collector island region 20 at a higher potential than the P collector of island region 30', so that all surface portions of the island 20–30' are effectively boot-strapped with the input (common mode signal). As is the case with FIG. 2, connection links 54 and 55, which respectively interconnect the emitter 53 of transistor Q1 to the base 62 (Node a) of transistor Q2 and node a to the emitter 62 of bias transistor Q3, are shown in schematic form in FIG. 4 to simplify the drawing. Unlike link 33 of the prior art configuration shown in FIG. 2, however, interconnect link 55 does not pass over a grounded portion or a ground link of the integrated circuit, so that the unwanted parasitic capacitance $C_p$ described above in conjunction with the description of FIGS. 1 and 2 is effectively eliminated. By the elimination of the parasitic capacitance, the collector current of the input transistor Q1 of the Darlington pair can be reduced significantly relative to the collector current of transistor Q2.

In a typical Darlington-coupled pair, the ratio of collector currents of the input and output transistors is typically on the order of 1:300. In the configuration shown in FIGS. 1 and 2, however, because of the need of a current sink 42 to discharge the parasitic capacitance $C_p$, the effective ratio of collector currents is reduced drastically (on the order of 1:7). By incorporating the bias transistor Q3 into the same dielectrically isolated island with transistors Q1 and Q2 in accordance with the present invention, however, the ratio of the collector currents in transistors Q1 and Q2 can be increased to a value on the order of 1:50, nearly an order of magnitude improvement over the prior art.

The ratio of the collector currents in transistors Q1 and Q2 is controlled by the voltage drop across resistor R1 and may be defined as:

$$V_{BEQ2} = V_{BEQ2} + I_1 R_1 \qquad (1)$$

The collector currents flowing through transistors Q2 and Q3 may be defined as:

$$I_{Q2} = I_{sn} \exp(V_{BEQ2}/V_T) \text{ and} \qquad (2)$$

$$I_{Q3} = I_{sp} \exp(V_{BEQ3}/V_T) \qquad (3)$$

Substituting equations (2) and (3) into equation (1) there is obtained:

$$V_T \ln(I_{Q2}/I_{sn}) - V_T \ln(I_{Q3}/I_{sp}) = I_1 R_1 \qquad (4)$$

Therefore, the magnitude of Current $I_1$ can be defined as:

$$I_1 = (V_T/R1) \ln(I_{Q2} I_{sp}/I_{Q3} I_{sn}) \qquad (5)$$

In setting the behavioral characteristics of the operational amplifier shown in FIGS. 3 and 4, the ratio of collector currents of transistors Q2 and Q3 is established at a prescribed value. Because of processing variables between successive runs of integrated circuit processing from wafer-to-wafer, the supply current $I_1$ must be established as a function of the saturation currents of transistors Q2 and Q3. For accomplishing this objective, a self-balanced bias circuit shown in FIG. 5 is employed to generate the current $I_1$.

Figure 5:
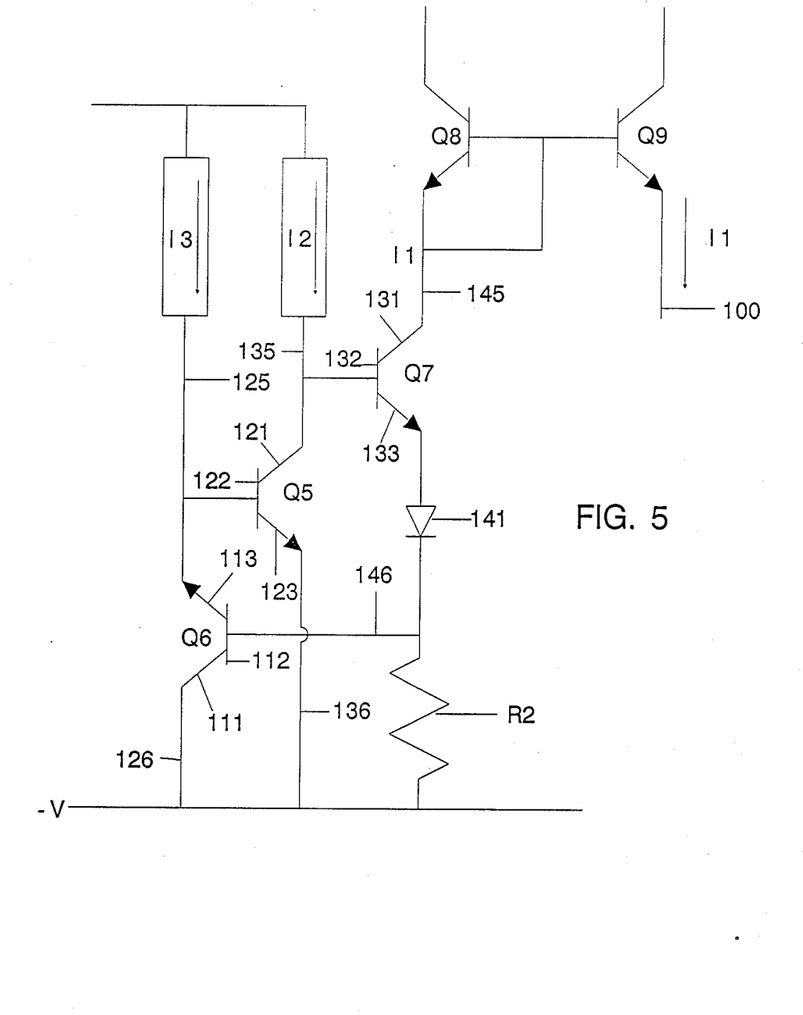
FIG. 5 is a diagrammatic illustration of a self-balanced bias circuit for controlling the bias current for the circuit of FIG. 3.

In the diagrammatic illustration shown in FIG. 5, current sources $I_2$ and $I_3$ correspond to the desired collector currents for transistors Q2 and Q3 of the circuit of FIG. 3. Current source $I_2$ is connected between a positive voltage supply link (+V) and a link 135 which is coupled to the collector of an NPN transistor Q5 and the base 132 of an NPN transistor Q7. Current source $I_3$ is coupled between positive supply link 130 and a link 125 which is coupled to the base 122 of transistor Q5 and the emitter 113 of PNP transistor Q6. The collector 111 of transistor Q6 is coupled over link 126 to a negative voltage supply link (−V). Similarly, the emitter 123 of transistor Q5 is coupled over link 136 to the negative supply link (−V). It will be noted that transistors Q5 and Q6 are of the same polarity and geometry and interconnected in the same manner as transistors Q2 and Q3 of the circuit shown in FIG. 3. Because transistors Q5 and Q6 are formed as part of the operational amplifier they are effectively matched with transistors Q2 and Q3 with respect to saturation currents. A negative feedback loop for controlling the current in transistor Q5 and Q6 is formed of NPN transistor Q7 the collector 131 of which is coupled over link 145 to a diode-connected current source transistor Q8, the collector current of which corresponds to the supply current I1. The emitter 133 of transistor Q7 is coupled via a diode (connected transistor) 141 to one end of a resistor R2 and to link 146 to which the base 112 of transistor Q6 is coupled. Like diodes 101, 102 and 103 in the circuit of FIG. 3, diode 141 provides balancing voltage drop ($V_{BE}$) and temperature compensation between the emitter 133 of transistor Q7 and the base 112 of transistor Q6. The other end of resistor R2 is coupled to the negative supply link ($-V$). A separate diode-connected transistor Q9 is coupled in parallel with transistor Q8 and represents the current source I1 for node 100 in the circuit of FIG. 3.

In operation, transistor Q5 and current source I2 behave as a common emitter voltage amplifier, while transistor Q7, resistor R2 and transistor Q6 form a buffer and unity gain feedback loop. With the values of current sources I2 and I3 being set at a prescribed ratio, then, because of the feedback loop through transistor Q7 between the collector 121 of transistor Q5 and the base 112 of transistor Q6, current I1 will be adjusted to prescribed value, so as to maintain the current flowing through transistors Q1 and Q2 at the ratio intended by sources I2 and I3.

More specifically, if the collector current flowing through transistor Q5 exceeds the value supplied by current source I2, the voltage at the base of Q7 will be lower than it would be if the collector current of Q5 were equal to I2. This will cause the voltage at the base of Q5 to be lower, by virtue of the unity gain connection between the base of Q7 and the base of Q5, than it would be if the collector current of Q5 were equal to I2. This will tend to reduce the collector current of Q5. This interaction will persist until the collector current of Q5 is brought into equality (to within the base current of Q7) with I2, and maintained there. This, in turn, maintains the current I1 at the proper value for maintaining the prescribed voltage drop $I_1R^1$ discussed above. Conversely, for a decrease in the current flowing through transistor Q5, there will be an increase in the base voltage at transistor Q7, thereby increasing the potential at the base 122 of transistor Q5 and increasing the current flow therethrough, thus causing a decrease in the collector current of Q5, to maintain the proper ratio between currents I2 and I3. This feedback balancing action ma be defined by equilibrium equations:

$$I_{Q5} = I_2 \qquad (6)$$

and $$I_{Q6} = I_3 \qquad (7)$$

For the circuit shown in FIG. 5, the magnitude of current I1 may be defined in the same manner that equation (5) was derived, namely $$I_1 = (V_T/R2)\ln(I_{Q5}I_{sp}/I_{Q6}I_{sn}) \qquad (8)$$

Equating expressions (5) and (8), there is obtained $$(1/R2)\ln(I_{Q5}I_{sp}/I_{Q6}I_{sn}) = (1/R1)\ln(I_{Q2}I_{sp}/I_{Q3}I_{sn}) \qquad (9)$$

By equating the values of resistances R1 and R2, expression (9) may be reduced to $$I_{Q2}/I_{Q3} = I_{Q5}/I_{Q6} = I_2/I_3 \qquad (10)$$

Thus, the ratio of the collector currents flowing through transistors Q1 and Q2 can be controlled irrespective of their saturation currents or the resistivity of resistances R1 and R2. Of course, it will be appreciated that it is necessary to constrain the ratio $I_2/I_3$ to ensure that $I_2I_{sp} > I_3I_{sn}$ for the full range of $I_{sp}$ and $I_{sn}$ that will be encountered.

As will be appreciated from the foregoing description, by incorporating the input bias transistor into the same dielectrically isolated island and effectively bootstrapping all components of the surface of the island to the common mode input signal, the parasitic capacitance at the emitter of the input transistor is effectively eliminated, so that the response time of the operational amplifier circuit to common mode excitation is significantly enhanced. A reduction in input device bias level of nearly an order of magnitude over that of the prior art is obtained. Moreover, by integrating a self-balancing bias circuit containing a pair of current control transistors effectively matched to the bias and output transistors of the input circuit of the amplifier, the ratio of the collector currents of the Darlington pair can be controlled irrespective of their saturation currents and the actual values of the bias resistances for a particular wafer processing run. In other words, there is effectively matching of the circuit configuration and of the physical and operational parameters of both the input circuit and the bias circuit. It should also be realized that in the circuit configuration shown and described, the polarization of the components (e.g. transistor Q1 is shown as an NPN transistor) and bias potentials therefor are not limited to those depicted. Where the polarities of the transistors are reversed, bias potentials are correspondingly inverted.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A transistor circuit comprising a Darlington-connected pair of first and second bipolar transistors, said first transistor having its base connected to an input terminal for receiving an input signal, its collector connected with the collector of said second transistor to receive a first bias voltage, the emitter of said first transistor being connected to the base of said second transistor, the emitter of said second transistor being coupled to a second bias source; and means, coupled to the emitter of said first transistor, for biasing said first transistor so as to minimize DC input current applied to the base of said first transistor without effectively causing the storage of a charge at a node coupled to the emitter of said first transistor, irrespective of the polarity and magnitude of signals applied to the base of said first transistor.

2. A transistor circuit according to claim 1, wherein said biasing means comprises a third bipolar transistor, the collector of which is coupled to the emitter of said second transistor, the emitter of which is coupled to the base of said second transistor and the base of which is coupled to receive a prescribed bias voltage.

3. A transistor circuit according to claim 2, wherein each of said first, second and third transistors is formed as a respective semiconductor device integrated within the same island region of a semiconductor substrate.

4. A transistor circuit according to claim 3, wherein said third transistor has a polarity-type opposite to that of said first and second transistors.

5. A transistor circuit according to claim 4, wherein within said island region a junction is formed between the collector region of said third transistor and the collector regions of said first and second transistor and further including means for reverse biasing said junction irrespective of the signal applied to the base of said first transistor.

6. A transistor circuit according to claim 1, further including means, coupled to the collectors of said first and second transistors, for maintaining a prescribed ratio of the collector currents of said first and second transistors irrespective of the saturation currents thereof.

7. A transistor circuit according to claim 2, further including a first current source and a first resistor coupled in series, said resistor being coupled across the base and collector of said third transistor to supply thereto said prescribed bias voltage.

8. A transistor circuit according to claim 2, further including means, coupled to the collectors of said first and second transistors, for maintaining a prescribed ratio of the collector currents of said first and second transistors irrespective of the saturation currents thereof.

9. A transistor circuit according to claim 8, wherein said ratio maintaining means comprises a fourth bipolar transistor the collector of which is coupled to a second current source, a fifth bipolar transistor the emitter of which is coupled to a third current source and to the base of said fourth transistor, the collector of said fifth transistor being coupled to the emitter of said fourth transistor, and means, coupled to the collector of said fourth transistor, to the base of said fifth transistor and to said first current source, for controlling the operation of said fourth and fifth transistors and thereby the magnitude of the current supplied by said first current source so as to maintain the ratio of the collector currents of said first and second transistors in accordance with the ratio of the currents supplied by said second and third current sources to said fourth and fifth transistors, respectively.

10. A transistor circuit according to claim 9, wherein said operation controlling means comprises a sixth bipolar transistor the collector-emitter path of which is coupled in series with a second resistor and said first current source, said second resistor being coupled across the base and collector of said fifth transistor, the base of said sixth transistor being coupled to the collector of said fourth transistor.

11. A transistor circuit according to claim 10, wherein said first and second resistors have effectively the same resistance value.

12. A transistor circuit according to claim 9, wherein the electronic behavioral characteristics of said second and third transistors are the same as those of said fourth and fifth transistors, respectively.

13. A transistor circuit according to claim 9, wherein said fourth and fifth transistors are formed as part of the same integrated circuit as said second and third transistors, whereby the electronic behavioral characteristics of said fourth and fifth transistors match those of said second and third transistors.

14. A transistor circuit according to claim 10, further comprising biasing means for maintaining the collectors of said first and second transistors reverse biased relative to the collector of said third transistor.

15. An operational amplifier having a pair of input circuits coupled to each other in a symmetrical arrangement, each input circuit having an input terminal, a respective one of said input circuits comprising:
first and second bipolar transistors connected in a Darlington configuration such that said first transistor has its base connected to an input terminal, its collector connected to the collector of said second transistor and its emitter connected to the base of said second transistor, the collectors of said first and second transistors and the emitter of said second transistor being coupled across a prescribed bias source;
a third bipolar transistor, the emitter of which is coupled to the emitter of said first transistor, the collector of which is coupled to the emitter of said second transistor, and the base of which is coupled to receive a bias voltage;
a first resistor coupled across the base and collector of said third transistor; and
a first current source coupled to said first resistor so as to supply thereto a first prescribed current for controlling the voltage drop across said first resistor and thereby said bias voltage for said third transistor, said first current source including means for controlling the ratio of collector currents of first and second transistors irrespective of the saturation currents thereof.

16. An operational amplifier according to claim 15, wherein each of said first, second and third transistors is formed as a respective semiconductor device integrated within the same region of a semiconductor substrate for eliminating the storage of charge via the connection of the emitter of said first transistor and the emitter of said third transistor, irrespective of the polarity of signals applied to said input terminal.

17. An operational amplifier according to claim 15, wherein said ratio controlling means comprises a fourth bipolar transistor the collector of which is coupled to a second current source, a fifth bipolar transistor the emitter of which is coupled to a third current source and to the base of said fourth transistor, the collector of said fifth transistor being coupled to the emitter of said fourth transistor, and means, coupled to the collector of said fourth transistor, to the base of said fifth transistor and to said first current source, for controlling the operation of said fourth and fifth transistors and thereby the magnitude of the current supplied by said first current source, so as to maintain the ratio of the collector currents of said first and second transistors in accordance with the ratio of the currents supplied by said second and third current sources to said fourth and fifth transistors, respectively.

18. A transistor circuit according to claim 17, wherein said operation controlling means comprises a sixth bipolar transistor the collector-emitter path of which is coupled in series with a second resistor and said first current source, said second resistor being coupled across the base and collector of said fifth transistor, the base of said sixth transistor being coupled to the collector of said fourth transistor.

19. A transistor circuit according to claim 18, wherein said first and second resistors have the same resistance value.

20. A transistor circuit according to claim 19, wherein said fourth and fifth transistors are formed as part of the same integrated circuit as said second and third transistors, whereby the electronic behavioral characteristics of said fourth and fifth transistors match those of said second and third transistors.

21. For use with an operational amplifier having a pair of input circuits coupled to each other in a symmetrical arrangement and having respective input terminals, a respective one of said input circuits comprising first and second bipolar transistors connected in a Darlington configuration such that said first transistor has s base connected to an input terminal, its collector connected to the collector of said second transistor and its emitter connected to the base of said second transistor, and means, coupled over a connection link to the emitter of said first transistor for biasing said first transistor to minimize DC current drawn at the base thereof, a method of eliminating the storage of charge via the connection link coupling the emitter of said first transistor to said biasing means comprising the step of forming each of said first and second transistors and said biasing means within a common semiconductor region in a semiconductor substrate isolated from other device regions therein.

22. A method according to claim 21, further including the step of biasing said common semiconductor region so that respective potentials of said region conform with changes in the level of a signal applied to the input.

23. A method according to claim 22, wherein said biasing means comprises a third bipolar transistor of a polarity opposite to that of said first and second transistors, the emitter of which is coupled to the emitter of said first transistor, the collector of which is coupled to the emitter of said second transistor, and the base of which is coupled to receive a bias voltage, and wherein said forming step comprises integrating said third bipolar transistor within said common region of said substrate.

24. A method according to claim 23, further comprising the step of coupling a first resistor across the base and collector of said third transistor and a first current source to said first resistor so as to supply thereto a first prescribed current for controlling the voltage drop across said first resistor and thereby the bias voltage for said third transistor, said first current source being capable of maintaining a prescribed ratio of collector currents of said first and second transistors irrespective of the saturation currents thereof 25. A method according to claim 24, wherein said first current source includes a fourth bipolar transistor the collection of which is coupled to a second current source, a fifth bipolar transistor the emitter of which is coupled to a third current source and to the base of said fourth transistor, the collector of said fifth transistor being coupled to the emitter of said fourth transistor, and a current control element, coupled to the collector of said fourth transistor, to the base of said fifth transistor and to said first current source, for controlling the operation of said fourth and fifth transistors and thereby the magnitude of the current supplied by said first current source, to maintain the ratio of the collector -currents of said first and second transistors in accordance with the ratio of the currents supplied by said second and third current sources to said fourth and fifth transistors, respectively.

26. A method according to claim 25, wherein said current control element comprises a sixth bipolar transistor the collector-emitter path of which is coupled in series with a second resistor and said first current source, said second resistor being coupled across the base and collector of said fifth transistor, the base of said sixth transistor being coupled to the collector of said fourth transistor.

27. A method according to claim 26, wherein said first and second resistors have the same resistance value.

28. A method according to claim 27, wherein said fourth and fifth transistors are formed as part of the same integrated circuit as said second and third transistors whereby the electronic behavioral characteristics of said fourth and fifth transistors match those of said second and third resistors.

* * * * *